United States Patent
Chan et al.

(10) Patent No.: US 7,863,717 B2
(45) Date of Patent: Jan. 4, 2011

(54) PACKAGE STRUCTURE OF INTEGRATED CIRCUIT DEVICE AND MANUFACTURING METHOD THEREOF

(75) Inventors: Shih Hsiung Chan, Hsinchu County (TW); Shen Bo Lin, Hsinchu (TW); Pin Chuan Chen, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 36 days.

(21) Appl. No.: 12/396,898

(22) Filed: Mar. 3, 2009

(65) Prior Publication Data

US 2009/0224385 A1    Sep. 10, 2009

(30) Foreign Application Priority Data

Mar. 5, 2008     (TW) .............................. 097107608 A

(51) Int. Cl.
H01L 21/98    (2006.01)

(52) U.S. Cl. ............... 257/676; 257/666; 257/E23.147; 438/108; 438/124

(58) Field of Classification Search ................. 257/676, 257/E23.147, E23.124, E21.705, 705, 666, 257/E23.705; 438/108, 124
See application file for complete search history.

(56) References Cited

U.S. PATENT DOCUMENTS

2009/0206358 A1*    8/2009   Chen et al. .................... 257/99

\* cited by examiner

*Primary Examiner*—Roy K Potter
(74) *Attorney, Agent, or Firm*—Raymond J. Chew

(57) ABSTRACT

A package structure of an integrated circuit device comprises a copper foil substrate, an integrated circuit device, a plurality of metal wires and an encapsulation material. The copper foil substrate comprises an IC bonding area, a plurality of conductive areas and an insulating dielectric material. The integrated circuit device is mounted on the surface of the IC bonding area, and is electrically connected to the plurality of conductive areas through the metal wires. The insulating dielectric material is between the IC bonding area and the conductive areas, and is also between two adjacent conductive areas. In addition, the encapsulation material covers the IC bonding area, the conductive areas and the integrated circuit device.

20 Claims, 6 Drawing Sheets

PACKAGE STRUCTURE OF INTEGRATED CIRCUIT DEVICE AND MANUFACTURING METHOD THEREOF

BACKGROUND OF THE INVENTION (A) Field of the Invention

The present invention relates to a package structure of an integrated circuit device and a manufacturing method thereof, and more particularly, to a thin package structure and manufacturing method of an integrated circuit device.

(B) Description of the Related Art

Due to rapidly increasing demand for advanced consumer electronic products, and greater requirements for energy-saving and environmentally responsible products, there is a trend toward thinner profiles in current integrated circuit device development. Some conventional integrated circuit packages utilize ceramic substrates. The ceramic substrates have superior capability to resist heat, but they are inferior in heat conductivity and heat dissipation. In addition, the ceramic substrates need adequate strength and rigidity so that the thickness of the ceramic substrates cannot be reduced indefinitely. The thickness of most ceramic substrates ranges from 1 mm to 3 mm, but such thickness cannot meet the new requirements of the thin-type package structure.

In view of the above, a new package structure and a manufacturing method thereof are urgently needed for the development of the thin-type package structure. Furthermore, the problems of heat dissipation also need to be resolved, and the manufacturing cost needs to be reduced so as to meet the requirements of the consumer electronics market.

SUMMARY OF THE INVENTION

One aspect of the present invention provides a package structure of an integrated circuit device and a manufacturing method thereof. In contrast to conventional ceramic substrates, a copper foil substrate can satisfy the development needs of further reductions in package structure thickness. Moreover, compared with the conventional ceramic substrates, the copper foil substrate improves heat dissipation due to its superior characteristic of heat conductivity.

According the aforesaid aspect, the present invention provides a package structure of an integrated circuit device comprising a copper foil substrate, an integrated circuit device, a plurality of metal wires and an encapsulation material. The copper foil substrate comprises an IC bonding area, a plurality of conductive areas and an insulating dielectric material. The integrated circuit device is mounted on the surface of the IC bonding area, and is electrically connected to the plurality of conductive areas through the metal wires. The insulating dielectric material is between the IC bonding area and the conductive areas, and is also between two adjacent conductive areas. In addition, the encapsulation material covers the IC bonding area, the conductive areas and the integrated circuit device.

The thickness of the copper foil substrate of the prevention invention ranges from 20 μm to 50 μm.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

The present invention provides a package structure of an integrated circuit device and a manufacturing method thereof. For complete understanding of the present invention, the following description will describe in detail the manufacturing steps and the composition. The present invention is not limited by the specified particulars of IC package structures that are familiar to a person skilled in the art. In addition, well-known compositions or steps are not described in detail so as to avoid any additional limitation. The preferable embodiments of the present invention are described in detail. In addition to the detailed descriptions, the present invention also can be applied to other embodiments. Therefore, the scope of the present invention is not limited, and is dependent on the following claims.

Figure 1A:
FIGS. 1A-1C are schematic diagrams illustrating the manufacturing processes of a copper foil substrate in accordance with a first embodiment of the present invention.
Figure 1B:
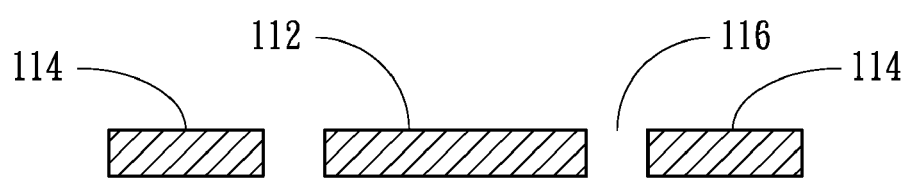
Figure 1C:
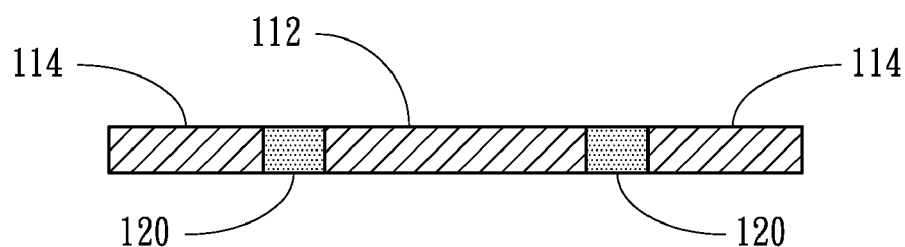

FIGS. 1A-1C are schematic diagrams illustrating the manufacturing processes of a copper foil substrate in accordance with a first embodiment of the present invention. As shown in FIG. 1A, a copper foil substrate 110 with a thickness ranging from 20 μm to 50 μm is provided. Subsequently, as shown in FIG. 1B, a plurality of slots 116 are formed on the copper foil substrate 110 by a drilling process, an etching process and a punching process. Two adjacent conductive areas 114 are isolated from each other through the slots 116, and the conductive areas 114 and the IC bonding area 112 are isolated from each other. Finally, as shown in FIG. 1C, an insulating dielectric material 120 is filled in the slots 116, and the copper foil substrate 100 is completed. The aforesaid insulating dielectric material 120 is selected from the group consisting of SiO, SiN, SiON, TaO, AlO, TiO, AlN, TiN, epoxy resin, silicone and polymer or the combination of elements of the group. The filling of the insulating dielectric material 120 can improve the isolation between two adjacent conductive areas 114 and between the conductive areas 114 and the IC bonding area 112. The insulating dielectric material 120 also increases the supporting rigidity of the copper foil substrate 100.

Figure 2A:
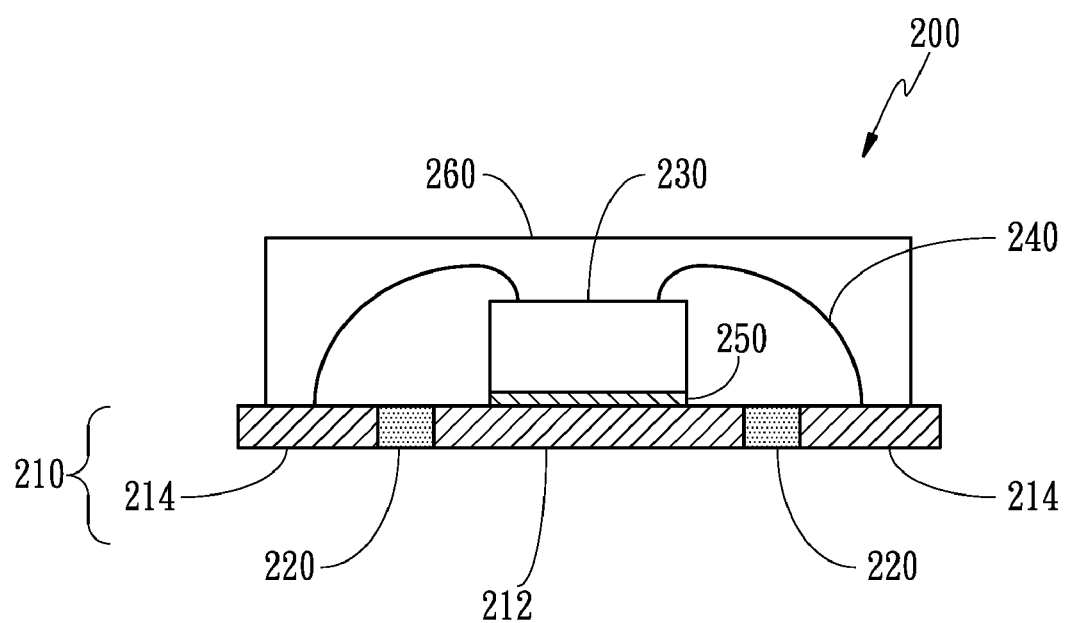
FIG. 2A is a cross sectional diagram of the package structure of an integrated circuit device in accordance with a second embodiment of the present invention.

FIG. 2A is a cross sectional diagram of the package structure of an integrated circuit device in accordance with a second embodiment of the present invention. First, a copper foil substrate 210 is provided. The copper foil substrate 210 comprises an IC bonding area 212, a plurality of conductive areas 214 and an insulating dielectric material 220. The insulating dielectric material 220 is between the IC bonding area 212 and the conductive areas 214, and is also between two adjacent conductive areas 214. Subsequently, an integrated circuit device 230 is mounted on the IC bonding area 212 of the copper foil substrate 210 using bonding technology. That is, the integrated circuit device 230 is fixed on the IC bonding area 212 of the copper foil substrate 210 through an adhesive material 250, and is then electrically connected to the plurality of conductive areas 214 of the copper foil substrate 210 through the metal wires 240. Therefore, the copper foil substrate 210 serves as the package carrier of the integrated circuit device 230 and the metal wires 240. The encapsulation material 260 covers the integrated circuit device 230, the metal wires 240, and the conductive areas 214 so that the objectives of moisture resistance and protection are achieved. The aforesaid bonding technology comprises any one of the following: the eutectic bonding method, the glass cement bonding method, the polymer bonding method and the soldering bonding method. The adhesive material 250 is selected from the group consisting of an alloy of gold and silicon, an alloy of gold and tin, an alloy of gold and germanium, an alloy of lead and tin, an alloy of lead, silver and indium, glass, gold, tin, a eutectic alloy, high heat-conductive metal glass cement, silver glass cement, epoxy and polymer adhesive (e.g. polyimide etc.) or the combination of elements of the group. The encapsulation material 260 is epoxy or silicone.

Figure 2B:
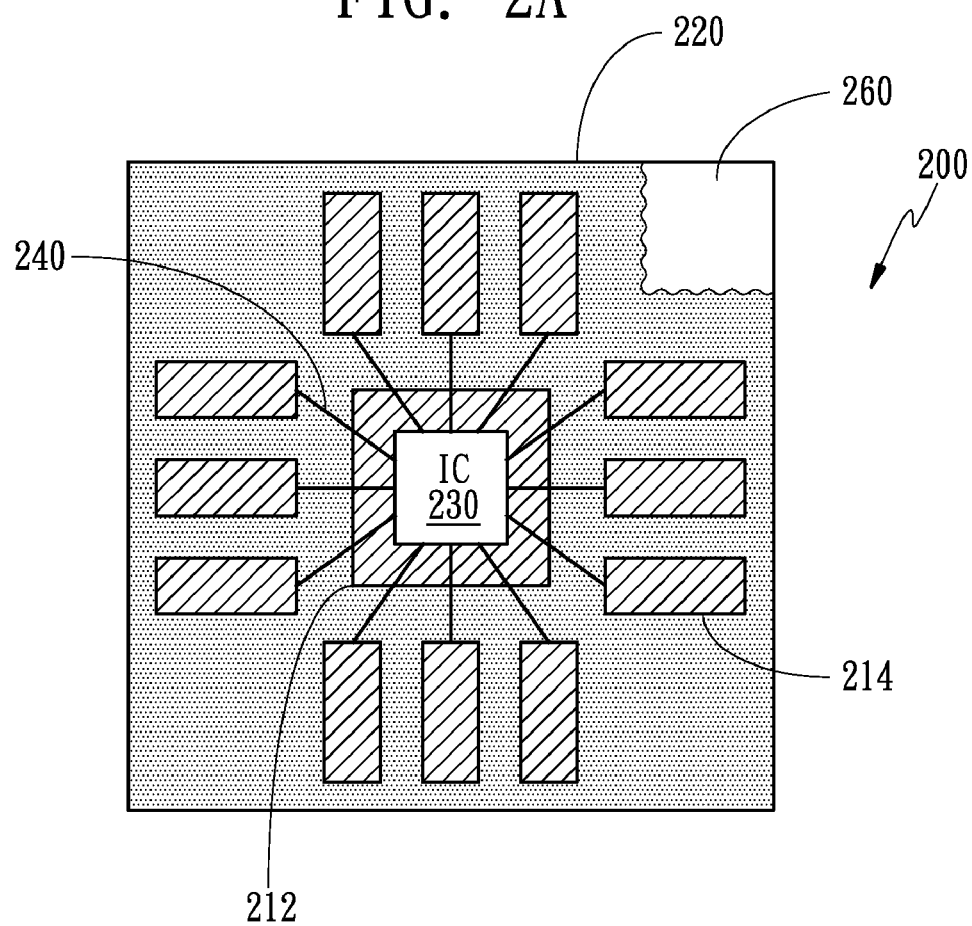
FIG. 2B is a top view of the IC package structure in FIG. 2A.

FIG. 2B is a top view of the IC package structure of FIG. 2A. In order to clearly show the connection of the integrated circuit device 230, the metal wires 240, and the copper foil substrate 210, a portion of the encapsulation material 260 in FIG. 2A is removed. The plurality of metal wires 240 are extended from the integrated circuit device 230 toward the conductive areas 214 and connect them.

The First Preferable Embodiment

Figure 2C:
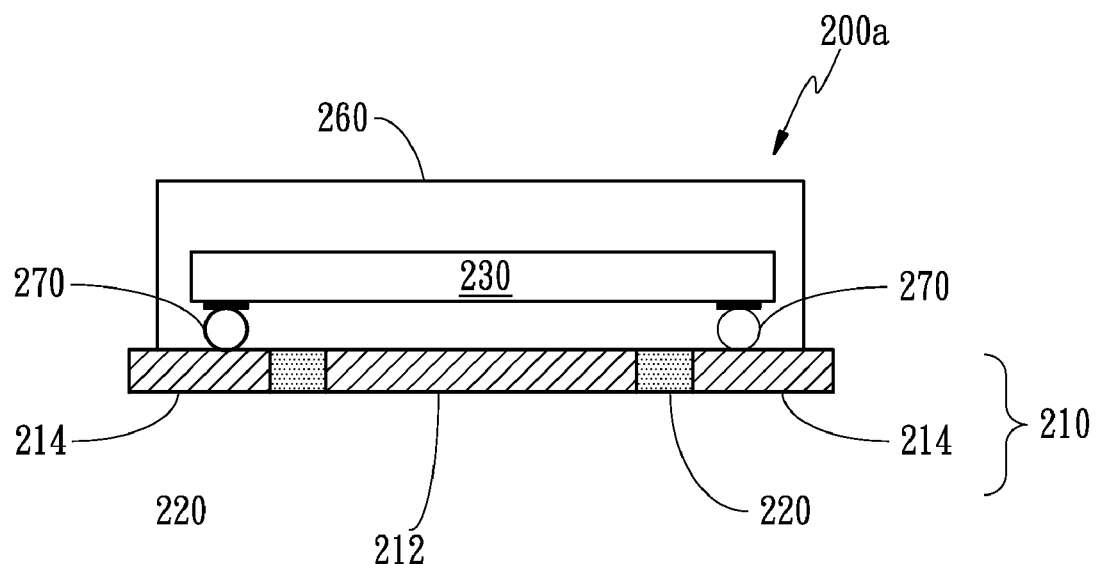
FIG. 2C is a cross sectional diagram of an IC package structure 200a in accordance with a preferable embodiment of the present invention.

FIG. 2C is a cross sectional diagram of an IC package structure 200a in accordance with a preferable embodiment of the present invention. The aforesaid IC package structure 200a mounts the integrated circuit device 230 on the conductive areas 214 of the copper foil substrate 210 through bumps 270 by using the flip chip process. Compared with FIG. 2B, the difference in FIG. 2C is that the active surface of the integrated circuit device 230 is turned down and faces the copper foil substrate 210. Soldering balls are utilized to connect the soldering pad on the integrated circuit device 230 to form the bumps 270. After reflowing, the bumps 270 are melted due to soldering flux, and are solidified to electrically connect the copper foil substrate 210. The encapsulation material 260 covers the integrated circuit device 230 and the copper foil substrate 210 by molding process so that the objectives of moisture resistance and protection are achieved. The advantages of the embodiment are shorter current paths and improved heat dissipation. In addition, the package structure is further miniaturized because the loop height of the metal wires 240 can be reduced.

The Second Preferable Embodiment

Figure 2D:
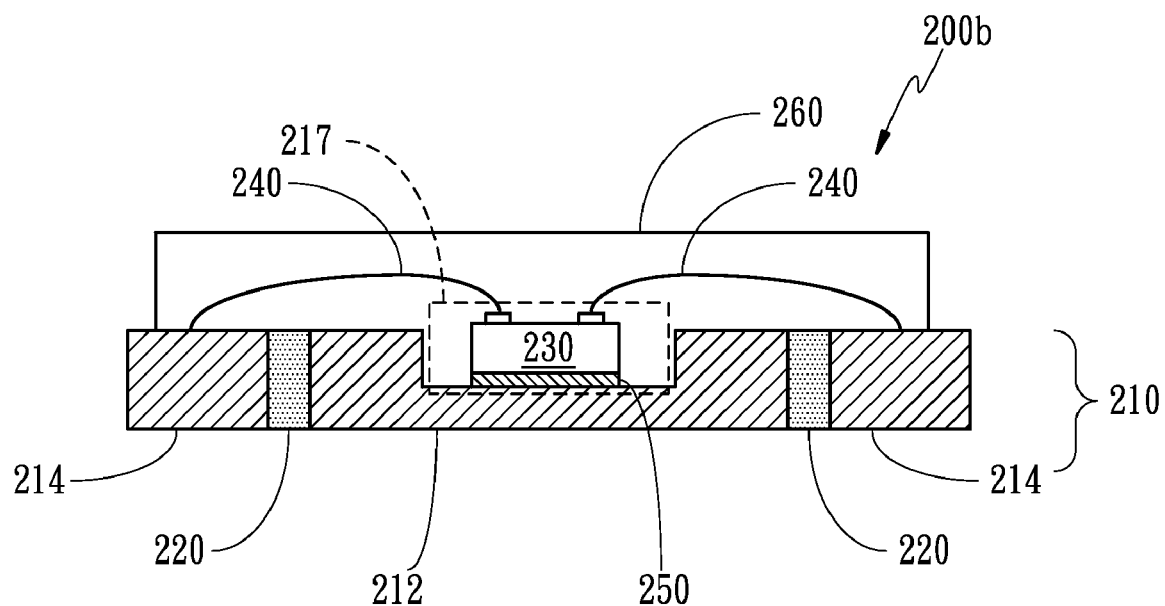
FIG. 2D is a cross sectional diagram of an IC package structure 200b in accordance with a preferable embodiment of the present invention.

FIG. 2D is a cross sectional diagram of an IC package structure 200b in accordance with a preferable embodiment of the present invention. Compared with the first embodiment, this embodiment can further reduce the thickness of the package structure. A die-bonding groove 217 is formed on the IC bonding area 212 of the copper foil substrate 210. Subsequently, the integrated circuit device 230 is mounted on the die-bonding groove 217 using the adhesive material 250. The metal wires 240 electrically connect the integrated circuit device 230 and the conductive areas 214. The encapsulation material 260 covers the integrated circuit device 230, the metal wires 240, and the conductive areas 214. The aforesaid formation methods of the die-bonding groove 217 comprise the lithography and etching process, the electroplating process and the drilling process. The advantages of the embodiment are as follows: when the integrated circuit device 230 is disposed in the die-bonding groove 217 and the metal wires 240 electrically connect the integrated circuit device 230 and the copper foil substrate 210, the die-bonding groove 217 can effectively reduce the loop height of the metal wires 240 so as to achieve the objective of further thinning the package structure.

The Third Preferable Embodiment

Figure 2E:
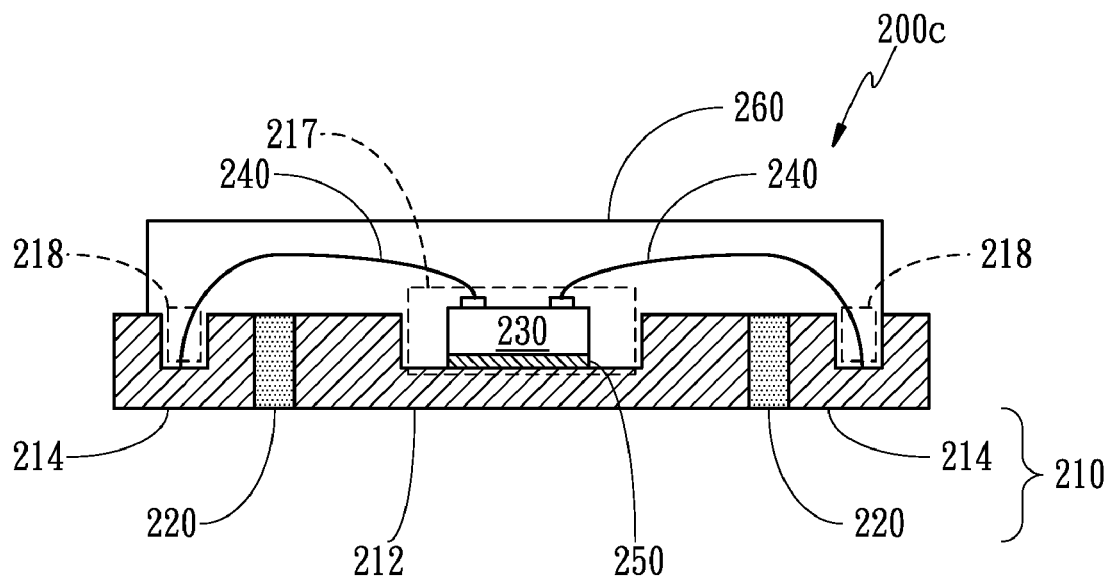
FIG. 2E is a cross sectional diagram of an IC package structure 200c in accordance with a preferable embodiment of the present invention.

FIG. 2E is a cross sectional diagram of an IC package structure 200c in accordance with a preferable embodiment of the present invention. Compared with the second embodiment, this embodiment further comprises a plurality of wire-bonding grooves 218 respectively formed on each of the conductive areas 214. The wire-bonding grooves 218 are formed by photolithography and etching process, the electroplating process and the drilling process. The wire-bonding groove 218 proposed by this embodiment allows the welding position of the second bond of the metal wire 240 to be moved to a lower position on the conductive area 214. Correspondingly, the loop height of the metal wires 240 is reduced so that the package structure of the integrated circuit device 230 is further reduced.

The Fourth Preferable Embodiment

Figure 2F:
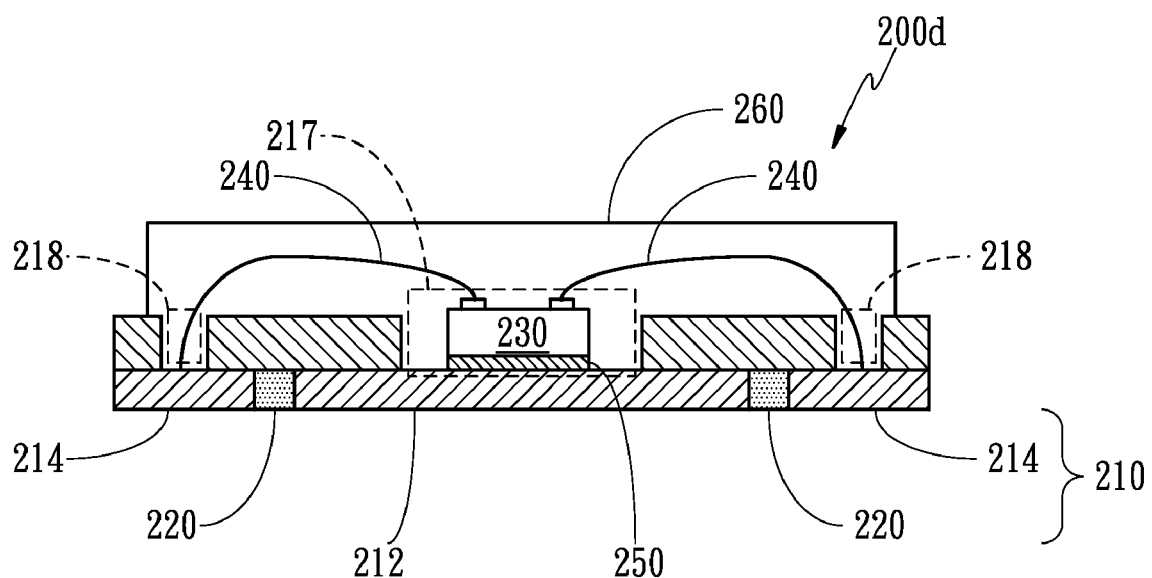
FIG. 2F is a cross sectional diagram of an IC package structure 200d in accordance with a preferable embodiment of the present invention.

FIG. 2F is a cross sectional diagram of an IC package structure 200d in accordance with a preferable embodiment of the present invention. Compared with the third embodiment, this embodiment has a different formation method of the die-bonding groove 217 and the wire-bonding grooves 218. A patterned insulating material layer 280 is formed on the copper foil substrate 210. That is, the die-bonding groove 217 and the wire-bonding grooves 218 are formed on the insulating material layer 280 by using a photolithography and etching process. Consequently, not only is the thickness of the package structure reduced, but the metal wires 240 on the conductive areas 214 can also be prevented from shorting due to improperly contacting the IC bonding area 212.

Figure 3A:
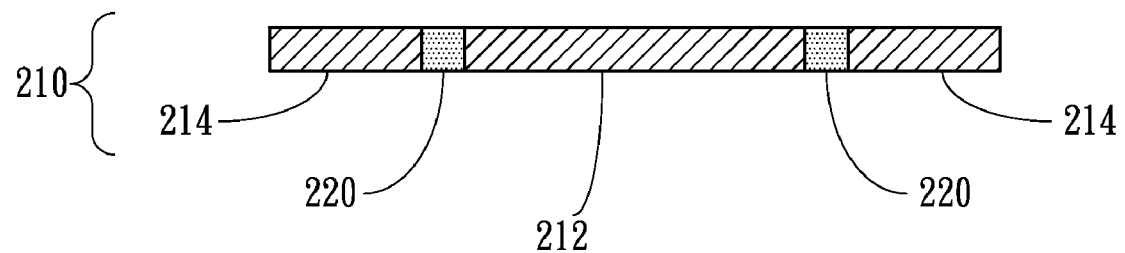
FIGS. 3A-3D are schematic diagrams illustrating the electroforming processes for forming a die-bonding groove and wire-bonding grooves.
Figure 3B:
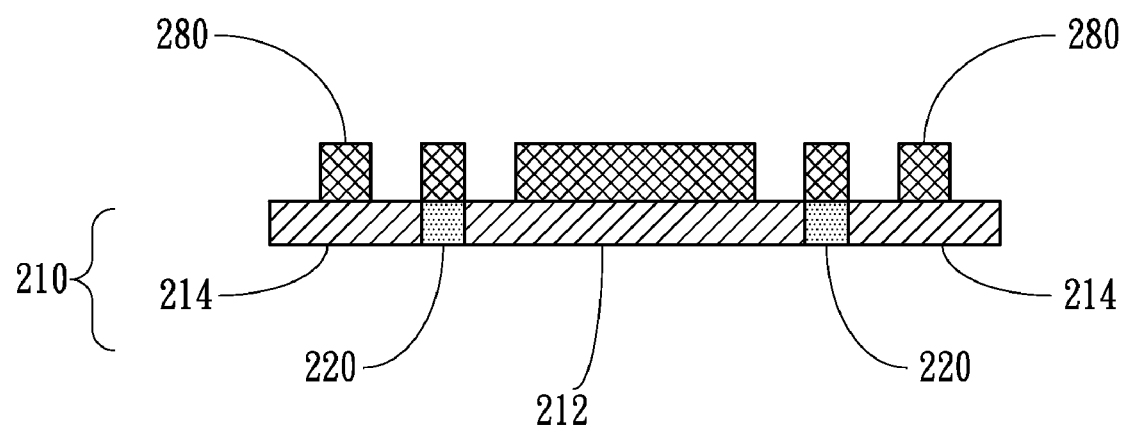
Figure 3C:
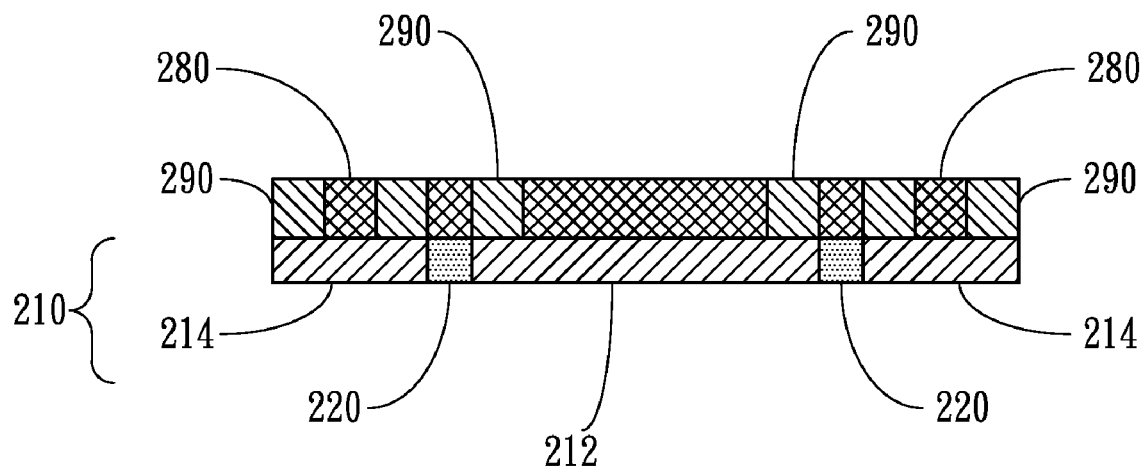
Figure 3D:
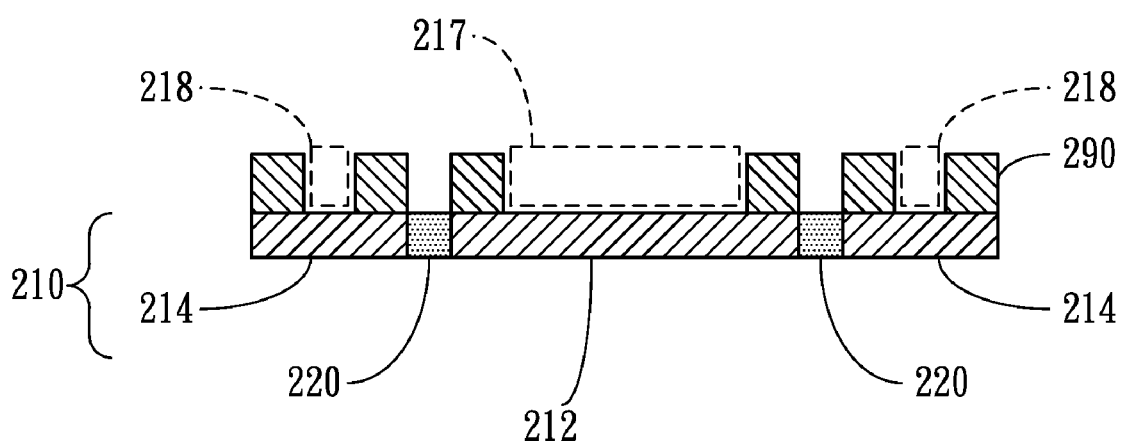

FIGS. 3A-3D are schematic diagrams illustrating the electroforming processes for forming a die-bonding groove 217 and wire-bonding grooves 218. A copper foil substrate 210 is provided, and a patterned insulating layer 280 is formed on the copper foil substrate 210, as shown in FIG. 3B. Subsequently, as shown in FIG. 3C, a metal layer 290 is deposited to grow on the exposed surface of the IC bonding area 212 and the plurality of the conductive areas 214 by the electroplating process. Finally, as shown in FIG. 3D, the insulating layer 280 is removed to form the die-bonding groove 217 and the plurality of wire-bonding grooves 218. The aforesaid insulating layer 280 is a photoresist material, and the step of removing the insulating layer 280 is a photoresist striping step.

According to the descriptions of the aforesaid embodiments, the present invention has many amendments and changes in these embodiments. Therefore, it is necessary to further refer to the scope of the following claims. In addition to the aforesaid detailed descriptions, the present invention can be widely applied to various other embodiments. The above-described embodiments of the present invention are intended to be illustrative only. Those skilled in the art may devise numerous alternative embodiments without departing from the scope of the following claims.

What is claimed is:

1. A package structure of an integrated circuit device, comprising:
   a copper foil substrate comprising an IC bonding area, a plurality of conductive areas and an insulating dielectric material, wherein the insulating dielectric material is between the IC bonding area and the conductive areas, and is between an adjacent pair of the conductive areas;
   an integrated circuit device disposed on the IC bonding area and electrically connected to the plurality of conductive areas; and
   an encapsulation material overlaying the IC bonding area, the conductive areas and the integrated circuit device.

2. The package structure of an integrated circuit device of claim 1, further comprising an adhesive material between the integrated circuit device and the IC bonding area.

3. The package structure of an integrated circuit device of claim 2, wherein the material of the adhesive material is selected from a group consisting of an alloy of gold and silicon, an alloy of gold and tin, an alloy of gold and germanium, an alloy of lead and tin, an alloy of lead, silver and indium, glass, gold, tin, a eutectic alloy, high heat-conductive metal glass cement, silver glass cement, epoxy, polyimide, and polymer adhesive or the combination of elements of the group, and the insulating material is selected from a group consisting of SiO, SiN, SiON, TaO, AlO, TiO, AlN, TiN, epoxy resin, silicone and polymer or the combination of elements of the group.

4. The package structure of an integrated circuit device of claim 1, wherein the thickness of the copper foil substrate ranges from 20 μm to 50 μm.

5. The package structure of an integrated circuit device of claim 1, further comprising a plurality of metal wires electrically connecting the integrated circuit device and the conductive areas, wherein each of the conductive areas further comprises a wire-bonding groove to which the metal wire is bonded.

6. The package structure of an integrated circuit device of claim 1, further comprising a plurality of bumps electrically connecting the integrated circuit device and the conductive areas.

7. The package structure of an integrated circuit device of claim 6, wherein the IC bonding area further comprises a die-bonding groove in which the integrated circuit device is disposed.

8. The package structure of an integrated circuit device of claim 1, further comprising a patterned insulating material layer disposed on the copper foil substrate, wherein the insulating material layer comprises a die-bonding groove on which the integrated circuit device is mounted.

9. The package structure of an integrated circuit device of claim 5, further comprising a patterned insulating material layer disposed on the copper foil substrate, wherein the insulating material layer comprises a die-bonding groove on which the integrated circuit device is mounted and at least one wire-bonding groove to which the metal wire is bonded.

10. A manufacturing method of a package structure of an integrated circuit device, comprising the steps of:
    providing a copper foil substrate comprising an IC bonding area, a plurality of conductive areas and an insulating dielectric material, wherein the insulating dielectric material is between the IC bonding area and the conductive areas, and is between an adjacent pair of the conductive areas;
    mounting an integrated circuit device on the IC bonding area, and electrically connecting the integrated circuit device to the plurality of conductive areas; and
    overlaying an encapsulation material on the integrated circuit device, the IC bonding area, and the plurality of conductive areas.

11. The manufacturing method of a package structure of an integrated circuit device of claim 10, wherein the copper foil substrate is manufactured by the following steps:
    providing a copper foil substrate;
    forming a plurality of slots to separate the IC bonding area and conductive areas; and
    filling the insulating material in the slots.

12. The manufacturing method of a package structure of an integrated circuit device of claim 11, wherein the slots are formed by a drilling process, an etching process and a punching process.

13. The manufacturing method of a package structure of an integrated circuit device of claim 11, further comprising a step of forming a die-bonding groove on the IC bonding area, wherein the integrated circuit device is mounted on the die-bonding groove.

14. The manufacturing method of a package structure of an integrated circuit device of claim 10, further comprising a step of electrically connecting the integrated circuit device and the conductive areas through the metal wires.

15. The manufacturing method of a package structure of an integrated circuit device of claim 14, further comprising a step of forming a wire-bonding groove on each of the conductive areas, wherein the wire-bonding groove is for at least one metal wire to be bonded therein.

16. The manufacturing method of a package structure of an integrated circuit device of claim 14, wherein the step of mounting the die onto the first conductive film further comprises a step of disposing a patterned insulating material layer on the copper foil substrate, wherein the insulating material layer comprises a die-bonding groove onto which the integrated circuit device is mounted and at least one wire-bonding groove to which the metal wire is bonded.

17. The manufacturing method of a package structure of an integrated circuit device of claim 10, further comprising a step of electrically connecting the integrated circuit device and the conductive areas on the copper foil substrate through a wire bonding method or a flip chip bonding method.

18. The manufacturing method of a package structure of an integrated circuit device of claim 13, wherein the die-bonding groove or the wire-bonding grooves are formed by a drilling process, an etching process and a punching process.

19. The manufacturing method of a package structure of an integrated circuit device of claim 15, wherein the die-bonding groove or the wire-bonding grooves are formed by a drilling process, an etching process and a punching process.

20. The manufacturing method of a package structure of an integrated circuit device of claim 10, wherein the integrated circuit device is mounted on a surface of the IC bonding area through a eutectic bonding method, a glass cement bonding method, a polymer bonding method, and a soldering bonding method.

* * * * *